(12) United States Patent
Massler et al.

(10) Patent No.: US 8,646,409 B2
(45) Date of Patent: Feb. 11, 2014

(54) PLASMA BOOSTER FOR PLASMA TREATMENT INSTALLATION

(71) Applicant: Oerlikon Trading AG, Truebbach, Truebbach (CH)

(72) Inventors: Orlaw Massler, Eschen (LI); Hubert Eberle, Triesen (LI); Patrick Gschwend, Azmoos (CH)

(73) Assignee: Oerlikon Trading AG, Truebbach, Truebbach (CH)

( * ) Notice: Subject to any disclaimer, the term of this patent is extended or adjusted under 35 U.S.C. 154(b) by 0 days.

(21) Appl. No.: 13/648,899

(22) Filed: Oct. 10, 2012

(65) Prior Publication Data
US 2013/0040072 A1  Feb. 14, 2013

Related U.S. Application Data

(62) Division of application No. 11/416,344, filed on May 1, 2006, now Pat. No. 7,798,097, which is a division of application No. 12/874,624, filed on Sep. 2, 2010, now Pat. No. 8,307,783.

(30) Foreign Application Priority Data

May 4, 2005 (CH) ..................... 00788/05

(51) Int. Cl.
*C23C 16/00* (2006.01)

(52) U.S. Cl.
USPC .................................. 118/723 E

(58) Field of Classification Search
USPC ....... 118/723 E; 156/345.43, 345.44, 345.45, 156/345.46, 345.47; 204/298.01, 298.12
See application file for complete search history.

(56) References Cited

U.S. PATENT DOCUMENTS

| | | | | |
|---|---|---|---|---|
| 4,381,965 A | * | 5/1983 | Maher et al. | 156/345.45 |
| 4,637,853 A | * | 1/1987 | Bumble et al. | 156/345.45 |
| 5,061,359 A | * | 10/1991 | Babu et al. | 204/298.07 |
| 5,176,924 A | * | 1/1993 | Williams | 425/174 |
| 5,753,886 A | * | 5/1998 | Iwamura et al. | 219/121.43 |
| 2001/0006093 A1 | * | 7/2001 | Tabuchi et al. | 156/345 |
| 2002/0117480 A1 | * | 8/2002 | Hsu et al. | 219/121.4 |
| 2003/0051792 A1 | * | 3/2003 | Dommann et al. | 156/73.1 |
| 2004/0038033 A1 | | 2/2004 | Massler | |

FOREIGN PATENT DOCUMENTS

JP   H06-275547   9/1994

* cited by examiner

*Primary Examiner* — Sylvia R MacArthur
*Assistant Examiner* — Anna Crowell
(74) *Attorney, Agent, or Firm* — Notaro, Michalos & Zaccaria P.C.

(57) ABSTRACT

Vacuum treatment installation particularly for plasma coating workpieces has an arrangement for boosting and/or igniting a glow discharge plasma for the treatment of workpieces, and at least one hollow body of electrically conductive material, the hollow body including a hollow space and at least one entrance opening through which charge carriers flow in order to make possible ignition and operation of a plasma or to boost an existing plasma.

16 Claims, 3 Drawing Sheets

A

A'

B

PLASMA BOOSTER FOR PLASMA TREATMENT INSTALLATION

CROSS-REFERENCE TO RELATED APPLICATIONS

This is a divisional of U.S. patent application Ser. No. 12/874,624 filed Sep. 2, 2010, which is incorporated here by reference, which is a continuation of U.S. patent application Ser. No. 11/416,344 filed May 1, 2006, which is incorporated here by reference, which is now U.S. Pat. No. 7,798,097, and which claimed priority on Swiss patent application 00788/05, filed May 4, 2005, which priority claim is repeated here as well.

BACKGROUND

Field of the Invention

The invention relates to a plasma booster for a plasma treatment installation, in particular for use in a vacuum coating installation and for a vacuum treatment method.

Hot or cold cathodes are known, in which by applying a voltage between a cathode, for example a spiral-wound filament or a point with high negative potential, and an anode, electrons are extracted into the treatment space of a vacuum coating installation in order to increase the density of the charge carriers at that site. Such electron sources or ion sources are provided with their own electrical supply. The cathode is conventionally only connected with the treatment space of the plasma treatment installation via a screen in order to avoid loading of the cathode through reactive gas or other negative effects due to the plasma treatment process. Of disadvantage is, on the one hand, that the electrons are generated outside of the coating chamber and consequently further devices are necessary to transfer them into the treatment chamber with as few losses as possible. On the other hand, due to the additionally necessary electrical supply and complex structuring, for reasons of costs alone, only a small number of such electron or ion sources can be provided. Most often, if at all, only one such ion sources is provided with a plasma treatment installation.

Known methods for the deposition of DLC layers, i.e. layers with a high component of $sp^3$ carbon bonds, such as described for example in WO 01/79585, utilize an intermediate frequency excitation on the substrate in order to generate a layer deposition through the developing glow discharge. The glow discharge is generated between the parts and the installation wall by means of a DC or by means of a unipolar or bipolar pulsed substrate bias in the pressure range of conventional magnetron sputter deposition.

The pieces to be coated are therein actively included in the process. The achievable deposition rate is thereby inter alia strongly determined by the geometry of the configuration with respect to the workpiece coating in the coating installation, which causes strong fluctuations in the deposition rate. The condition may thereby arise that weak ionization is generated with a less active configuration. This leads to a low deposition rate and therewith to low productivity.

In known plasma treatment installations workpieces are held on substrate carriers, for example in the form of a carousel and guided past the coating source(s). Examples thereof are doubly rotating configurations with geometric distances outside the range of 20-80 mm, whereby no controlled hollow-cathode plasma is generated. Typical problem areas are the coating of plate configurations and flat parts, which generate only a low plasma stream.

In general an increase of the carbon supply by increasing the reactive gas flow is only possible to a limited extent through the throughput of the vacuum pumping system, since the layer quality is compromised when leaving the optimal process window.

SUMMARY OF THE INVENTION

The invention is based on the task of providing a plasma booster which can be installed into the plasma treatment space or directly onto a carousel or even integrated in a workpiece carrier without elaborate and costly additional measures.

This task is solved through the inventive characteristics in the claims. The plasma booster can therein be operated through a bias supply to impress an electric signal onto the workpieces.

Of the conventional plasma processes is known that, depending on the process pressure and the applied voltage, through specific geometric configurations one or several secondary plasmas may be generated through the so-called hollow-cathode effect. While having a locally restricted yet very high density, these secondary plasmas interfere with the planned plasma process through different effects such as overheating of individual substrates, plasma fluctuations, graphitization in the gas phase and others. For that reason in all conventional Plasma CVD methods precautions must be taken in order to avoid such secondary plasmas.

Through an arrangement implemented according to the invention it was unexpectedly achieved to utilize the hollow-cathode effect without damaging consequences onto process management or layer quality through a plasma booster with an empirically determinable geometry depending on the process parameters, such that a stable augmentation of the plasma density and a significant increase of the deposition rate becomes possible.

The arrangement according to the invention for augmenting and/or igniting a glow discharge plasma comprises at least one hollow body of an electrically conductive material, the hollow space of the hollow body being implemented such that when an electric signal is impressed on the hollow body, at least in a certain pressure and voltage range the geometric conditions for the ignition of a discharge in the interior of the hollow body are satisfied. The hollow body comprises furthermore at least one opening through which the charge carriers can flow off into the environs of the arrangement in order to permit there the ignition and operation of a plasma or to boost a plasma existing there.

The geometry is here selected such that the process temperature can be kept low to avoid affecting the properties of the workpieces. Critical for the geometry of the plasma booster substantially encompassing at least one hollow space are here the inner dimensions or a characteristic geometric parameter of the hollow space which represents a characteristic number for the mean distance of the areas of equal electric potential encompassing the hollow space. For example for a pressure range of $1\times10^{-3}$ mbar to $5\times10^{-2}$ mbar, preferably $4\times10^{-3}$ mbar to $2\times10^{-2}$ mbar a mean distance range of 20 to 200 mm, preferably 60 to 100 mm has been found to be suitable.

The application of this principle can take place thereby that at least one arrangement according to the invention is installed as a plasma booster into the loading of a carousel with workpiece carriers, whereby the plasma density is increased in the entire treatment space and, for example, a higher deposition rate can be attained.

Alternatively, the workpieces can be fastened directly on an arrangement according to the invention and therewith come directly into connection with the plasma of the hollow cathode. Combinations of various embodiments of the arrangement according to the invention can be also be utilized advantageously.

In the following an attempt is made to explain the phenomena underlying the invention by means of known laws of physics. However, this can only be seen as a, possibly flawed, approximation to the relationships obtaining in an industrial coating installation. These relationships may differ significantly from the models developed by means of exemplifying simplified assumptions, for example with respect to the complex geometries occurring or moved electrodes.

Under the assumption that an arrangement according to the invention for boosting the plasma, which is comprised either of one or several plasma booster trees or of substrate trees of corresponding geometry, they represent a cathode for a glow discharge, the anode being the coating chamber which is preferably at ground potential. For the ignition of the glow discharge a voltage is applied between anode and cathode which is between 200 V and 2000 V, preferably between 400 V and 1200 V, each including the limit values. After the ignition the discharge can also be operated at a lower voltage.

The ignition of the plasma follows Paschen's law. According to this law the ignition voltage $V_t$, or the ignition potential $E_t$ is a function of the type of gas and at a given type of gas is a function of the product of electrode distance d and pressure p:

$$V_t = [B \times p \times d]/[C + \ln pd], E_t = B/[C + \ln pd];$$

where B and C are gas type-dependent constants.

As is known to a person of skill in the art, there are different options for improving the ignition process. For example when applying a DC voltage, it can be briefly pulsed at high frequencies. Independently of the type of operator voltage, which may be a DC, a bipolar or unipolar pulse, a conventional AC voltage or also a modulated DC voltage, the ignition of a plasma booster according to the invention can be affected or improved through the following measures:

rapid pressure fluctuations,
brief voltage increase (single voltage pulse),
pulse operation of the voltage source,
applying an external magnetic field perpendicularly or parallel to the cathode/anode discharge gap,
additional operation of a plasma, for example in the form of a sputter, spark or low-voltage arc plasma,
choice of a readily ionizable gas, such as for example Ar, Ne, He.

Increase of the plasma density by means of a magnetic field is here of particular significance, since therewith the probability for ionization of the gas in the entire plasma space increases. For all conditions under which the speed of the charge carriers in the plasma is not parallel to the magnetic field, forces occur which force these charge carriers onto a circular path. In the relatively small cathode drop region the movement of the charge carriers is only affected to a minor extent due to the relatively high field strengths. In contrast, the magnetic field has a stronger effect on the positive column. The forces of the magnetic field decrease the outward diffusion of the charge carriers and increase the plasma density through the increased impact probability with the gas molecules.

The plasma booster according to the invention is essentially based on the effect of the increase of the plasma density through the ignition of a hollow cathode. If a discharge is operated such that to one anode several cathodes are assigned, the distance of the cathodes from one another is of importance. If the distances of the cathodes from one another are greater than twice the cathode drop, no mutual effect occurs. If the cathodes are moved closer to one another or if the plasma density is decreased, faster electrons from the one cathode surface enter the cathode drop region of the other cathode and therein are decelerated through the charge, which is also negative, and are reflected. This reflection at the cathode potentials proceeds until the electron has lost energy, for example through impact. Through the reflection, in turn, the ionization probability is increased. The current density increases and may increase by a factor of more than hundred as a function of the type of gas, of the pressure, the distance or the geometry.

However, at a very small distance of the cathodes with respect to one another the current density falls rapidly again, which is explained therewith that the current no longer finds its way to the anode out of the gap between the two cathodes.

The mutual effect of the cathodes is referred to as hollow cathode effect. It is formed if a cathode has hollow spaces which have a diameter smaller the twofold drop space. The size of the cathode drop space can be strongly affected by the application of a magnetic field.

In conventional plasma treatment installations or electrode configurations the development of hollow cathodes, in particular in the direct proximity to the surface to be treated, has until now been avoided as much as possible since, in general, through the formation of such, so-called secondary plasmas highly negative effects result for the plasma treatment process. For example through such discharges energy may be withdrawn from the plasma, the reactive gas may be too rapidly or too completely dissociated or the workpiece surfaces may be overheated, to describe only some of the disturbing phenomena.

One aim of the present invention, in contrast, is providing a plasma booster which avoids the disadvantageous effects of a hollow cathode and increases the plasma density within and outside of the plasma booster to such a degree that it contributes to the improvement of the treatment process. The plasma density in the interior is here significantly higher, which is of advantage for better dissociation or excitation, respectively, of gaseous precursors.

BRIEF DESCRIPTION OF THE DRAWINGS

The principle of the invention will be described by example in conjunction with the following drawing. Therein depict.

DETAILED DESCRIPTION OF THE INVENTION

Figure 1:
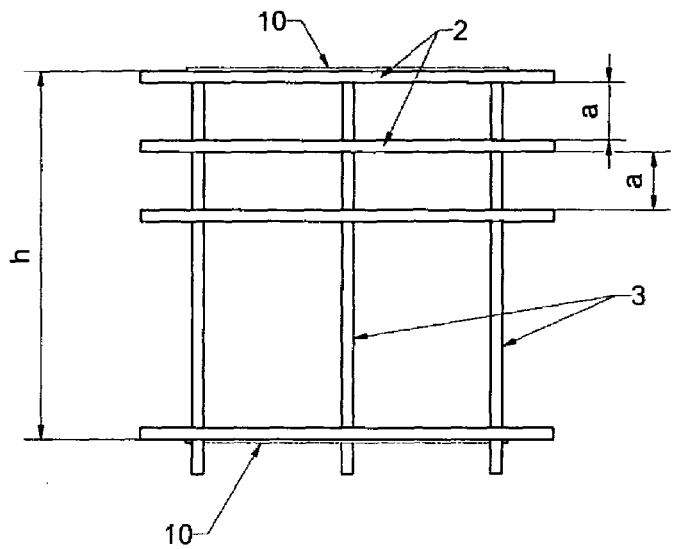
FIG. 1 a plasma booster
FIG. 2 a workpiece holder
FIG. 3 a carousel
Figure 1:
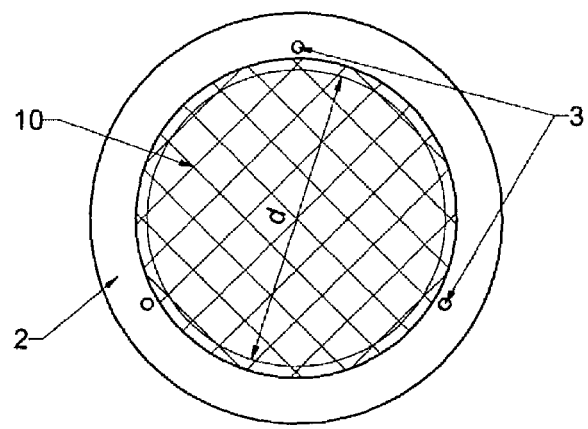
Figure 1:
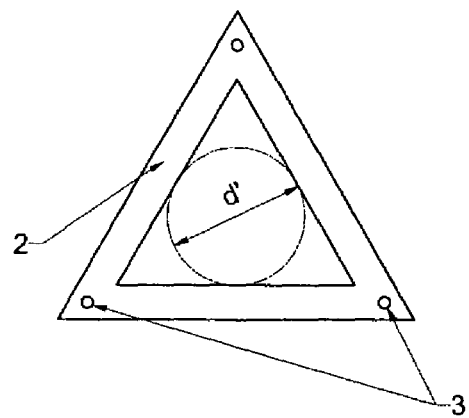

The plasma booster 1 shown in FIG. 1 is structured of several superjacent circular, elliptical or polygonal annuli 2 or annuli of combined geometries, the annuli 2 being disposed at a distance a, which is sufficiently small to avoid the ignition of a hollow discharge between the annuli 2. If the distance is chosen even only slightly too large, the ignition of a highly intensive undesired secondary plasma occurs between the parallel cathodes 2, with the above described disadvantageous consequences.

Distance a between the cathode annuli 2, or distance b between the workpieces or mountings must consequently be small compared to the two-fold cathode drop, advantageously even smaller than the cathode drop distance. In the present embodiment a distance a of 1 to 60 mm, preferably 5 to 25 mm was chosen.

The total height h of the plasma booster 1 can readily be varied by adding or omitting one or several annuli 2. The annuli 2 can for example be held in the desired position by individual connection rods 3 with spacer sleeves not further shown here.

In the case of the present FIG. 1 A, A', the geometrically characteristic parameter is the inner diameter d of the cathode annuli which also represents the essential dimension for generating and stabilizing the hollow cathode. In FIG. 1 B the diameter d' of the circle inscribed in the triangle is assumed as the characteristic parameter. The diameter d, d' should therefore be chosen such that the conditions for a hollow cathode are satisfied, i.e. smaller or approximately equal to the twofold cathode drop. In the present embodiment a distance d of 20 to 200 mm, preferably between 60 to 100 mm was selected. Together with the height h, the diameter d, d' consequently defines the geometry of the hollow cathode, which can not only be implemented in a different geometry of the cross section, but also be delimited against the remaining plasma space through different delimitation areas. For example, instead of many annular segments 2, only one upper and one lower annular segment may be provided with a grid spanned in between or parallel wires or rods, cylinder or other hollow body with suitable openings or cut-outs on the circumference, for example in the form of slots or the like. It is important that there is at least one opening of the hollow cathode which keeps open the path of the charge carriers to the anode.

In the embodiment depicted in FIG. 1 it was further found that covering of the upper or lower opening by a metal grid 10 can have a positive effect on the stability of the plasma.

Figure 2:
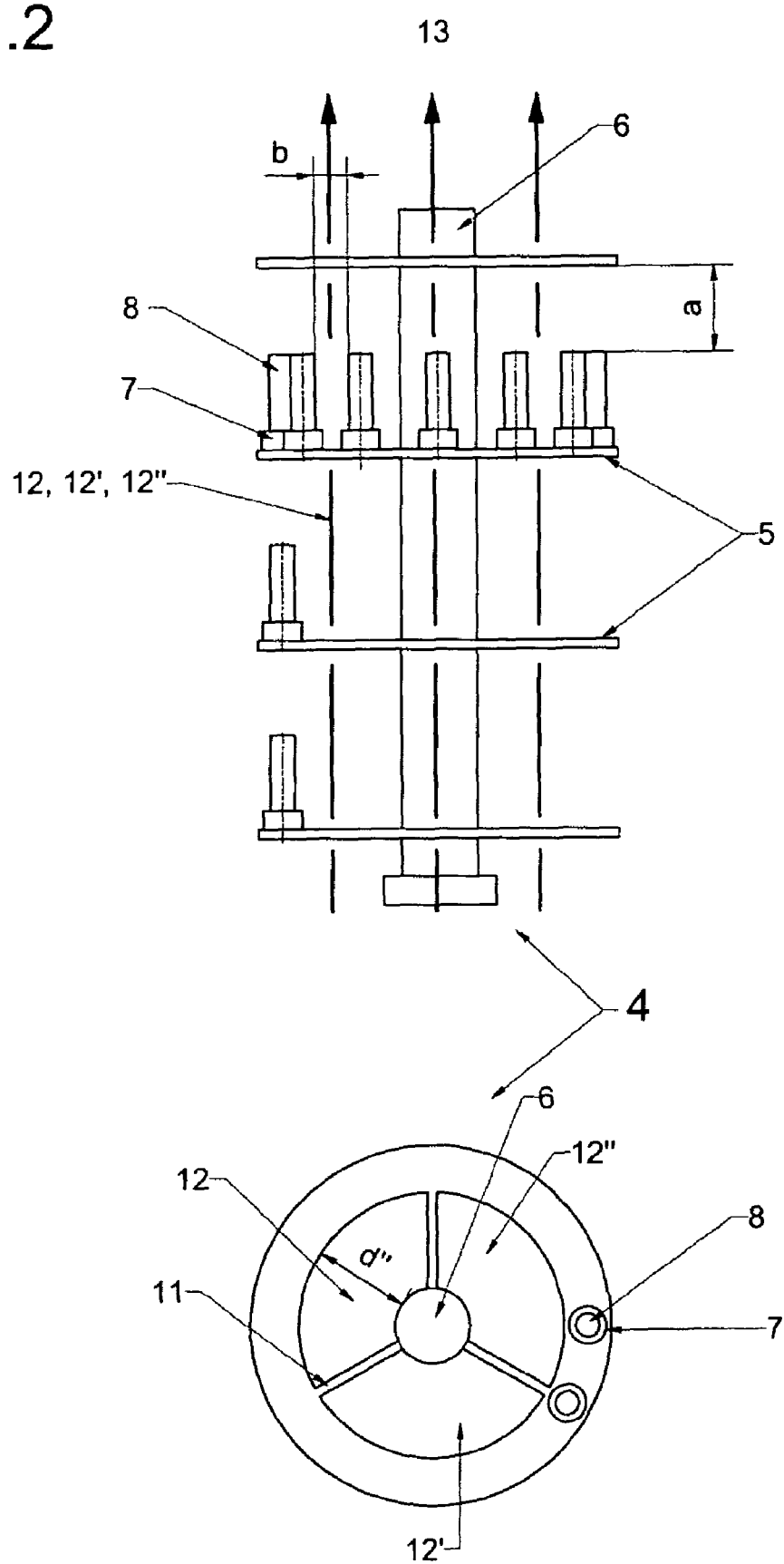

FIG. 2 shows a workpiece carrier 4 implemented as a plasma booster. The annuli 5 are provided with receptions 7 for workpieces 8. The characteristic parameter d" can here be viewed either, as depicted, as the smallest distance of the workpiece carrier 5 from a carrier rod 6, or as the smallest distance between the spokes 11 of the workpiece carrier, depending on which distance is smaller. It is here also essential that the distance a as well as the distances b between the workpieces 8 is chosen such that no ignition of a hollow cathode discharge occurs. At least the workpieces of one workpiece carrier plane should therefore have very similar, or better identical, geometries or the appropriate distances a or b, respectively, should be set. To attain as uniform a hollow discharge plasma as possible over the height of the plasma booster 4, it is advantageous to provide the spokes 11 of the particular workpiece carrier annuli 5 in the same position such that, as shown for example in the case depicted in FIG. 2, three identical hollow cathode spaces 12, 12', 12" are formed in the interior of the plasma booster 4.

In principle a single workpiece carrier annulus 5 with a hollow cathode space 12 or a single annulus 2 can already be applied as a plasma booster provided the geometry suitable for the corresponding pressure/voltage range is chosen. However, it is understood by a person of skill in the art that appropriate plasma boosters 1 or workpiece carriers 4 implemented as plasma boosters comprised, as depicted in FIG. 1 or 2, of several planes of annuli 2 or of workpiece carrier annuli 5 achieve a significantly stronger effect. In such plasma boosters 1, 4, for example, reactive gas or precursors for plasma CVD or combined PVD/CVD processes can be highly efficiently excited or split and converted into highly reactive species, for example ionized molecules, molecule fragments and/or into radicals. Therewith the deposition rate is also significantly increased and with suitable process management the layer quality of such plasma CVD layers is improved.

Figure 3:
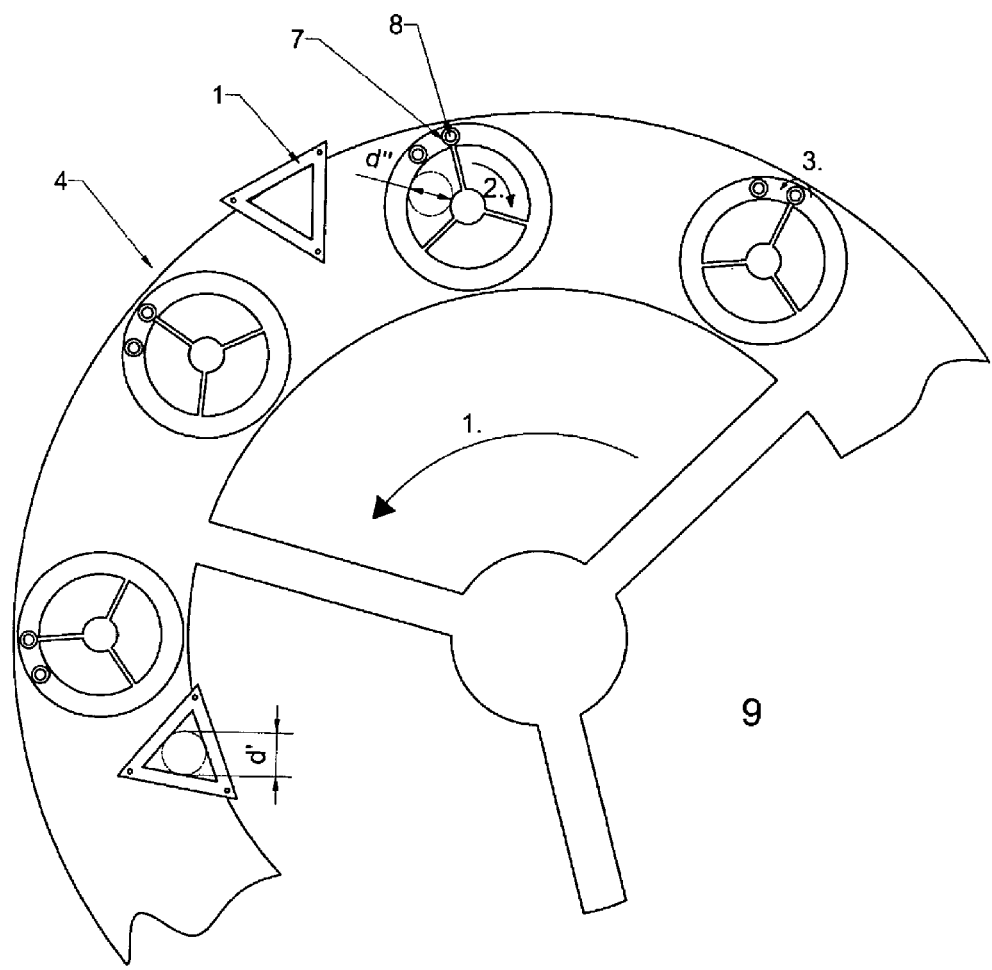

In FIG. 3 is depicted a carousel 9 on which several plasma boosters 1, as shown in FIG. 1, as well as also several workpiece carriers 4, as implemented in FIG. 2, are disposed. The workpiece carriers 4 can therein be mounted such that they are rotatably movable and, for example as depicted, in cooperation with carousel 9 and receptions 7 bring about the triple rotation of the workpieces 8 in order to achieve a maximally uniform coating quality. Such a triple rotation is depicted schematically through the corresponding movement arrows 1., 2. and 3. It is advantageous if the characteristic geometric distance d' of plasma booster 1 is at least slightly smaller than the characteristic geometric distance d" of the workpiece carrier 4, whereby with the application of a, for example, intermediate-frequency pulse signal according to the Paschen equation, first the plasma in the plasma boosters is ignited.

Such a configuration is especially advantageous if, for example, starting from a metallic adhesion layer, a graduated transition to a DLC layer is to be generated. If the adhesion layer is initially applied of a pure metal, for example Cr or Ti, and, as is known to the person skilled in the art, other metals of subgroup IV, V or VI of the periodic table of elements or Si or Al can be considered, through a sputter, an arc, a lowvoltage arc or another PVD method and subsequently a carbon-containing gas, for example acetylene, methane, ethane, ethylene or the like are added, a mixed layer is formed essentially containing metal and metal carbide. However, the formation of $sp^3$-containing carbon structures does not or only minimally occur as long as only a DC bias is applied, since in this case the reactive gas is excited or dissociated by the plasma at too low an extent. However, if, for example, an intermediate-frequency pulse signal is impressed on the carousel 9, the hollow cathode plasma, due to the smaller distance d, d' ignites first in the plasma boosters 1. The ignition is facilitated by each additional plasma source, for example through the glow discharge of the sputter targets and, if required, through an additional magnetic field applied perpendicularly to the hollow cathode plane. This can be generated for example through a Helmholtz configuration of two magnetic coils in a coating installation.

After the ignition of the hollow cathode plasma in the plasma boosters 1, through the increased consumption of the reactive gas, a pressure drop occurs, which leads to a rapid ignition of a further hollow cathode plasma in the hollow spaces 12, 12', 12" of the workpiece carriers 4 and a further depletion of reactive gas. The ignition of the plasma in the workpiece carriers 4 takes place through the already high fraction of charge carriers from the plasma boosters 1 entirely synchronously and without plasma fluctuations. If the reactive gas fraction is increased, which advantageously takes place in the form of a, for example, ramp-like increase of the reactive gas flow, at the surface of the materials a high fraction of highly excited carbon or hydrocarbon ions are available which make the buildup of $sp^3$-structures possible. Depending on the process management, now metal-containing $sp^3$-structures or, for example by back-regulation or screening off the targets, $sp^3$-structures substantially comprised only of carbon and hydrogen can be deposited. A further advantage is obtained when using such plasma boosters 1 or workpiece carriers 4 thereby that the process can be managed such that even in the deposition of insulating, for example DLC layers, on workpieces, the conductivity on the inside of the plasma booster 1 or of the workpiece carrier 4, is retained. This results due to temperature loading increased in this region or due to the increased bombardment with ionized particles, which causes graphitization on the inner surface of the hollow body or of the hollow cathode when using, for example, a carbon-containing reactive gas.

In the following in conjunction with examples, the distinction from prior art and the advantageous effect of the employment of plasma boosters according to the invention will be demonstrated. Details regarding the process parameters and geometric implementation of the arrangement can be found in Table 1. The process was carried out on a carousel with 6 or 12 trees.

EXAMPLE 1

Here the workpieces are charged according to prior art onto trees such that a hollow cathode is avoided. The substrate current in the process is low, the coating rate is low.

EXAMPLE 2

Here the pieces are charged onto trees which correspond to an arrangement according to the invention. When an IF bias is impressed a hollow cathode is thereby ignited and an increase of the substrate current as well as an increased deposition rate compared to Example 1. The geometric parameters of the hollow discharge were so adapted to the process parameters that the pieces were neither overheated nor the layer quality negatively affected.

EXAMPLE 3

Here the workpieces were charged as in Example 1, additionally, two of 12 trees were replaced with an arrangement described as in FIG. 1. Alternatively, on one carousel loaded with 6 trees, additionally, 3 plasma boosters 1 as in FIG. 3 were utilized. In both cases a positive effect on the deposition rate was observed.

EXAMPLE 4

Here the pieces were charged onto an arrangement as in Example 2, the hollow cathode is operated at a higher pressure, which leads to an additional increase of the substrate current and of the deposition rate compared to example 1 and 2. Under these conditions the pieces were also neither overheated nor the layer quality negatively affected.

EXAMPLE 5

Here the distances were greater than in Example 1, however, smaller than in Example 2. Clearly, d" here corresponds to a mean distance in the range of a maximal electron reflection, since here the hollow cathode burns very intensively, the pieces are overheated and a poor layer quality is generated through the graphitization.

EXAMPLE 6

Shows a marked dependence of the effect of the plasma booster on the frequency of the impressed electric signal. With a frequency increase of 50 to 100 kHz, at otherwise constant parameters, a significant increase, compared to Example 4, of the substrate current and of the coating rate could be achieved.

Although in the preceding many different feasibilities for carrying out the invention were described, it is evident to a person of skill in the art by means of the description that there are still a large number of other feasibilities for realizing corresponding arrangements for ignition or boosting the plasma. For example a corresponding arrangement can also be disposed on the vacuum chamber, the chamber bottom or chamber cover instead of on the carousel provided the arrangement is insulated from the receptacle and a corresponding electric signal, for example the substrate bias signal, is impressed.

TABLE 1

Examples of the Invention

|  | Example 1: Prior Art | Example 2: Setup with triply rotating parts on the arrangement | Example 3: Setup with additional arrangements without loading | Example 4: Setup with triply rotating parts on the arrangement | Example 5: Setup on arrangement with distances that are too small | Example 6: Setup with triply rotating parts on the arrangement |
|---|---|---|---|---|---|---|
| Reactive gas flow | 220-320 sccm | 220-350 sccm | 220-350 sccm | 350-500 sccm | 220-350 sccm | 350-500 sccm |
| Working pressure | 5.0-7.0 $10^{-3}$ mbar | 5.0-7.0 $10^{-3}$ mbar | 5.0-7.0 $10^{-3}$ mbar | 7.0-1.2 $10^{-2}$ mbar | 4.5-7.0 $10^{-3}$ mbar | 7.0-1.2 $10^{-2}$ mbar |
| Distance d" workpiece to mounting surface | 10 mm | 60-100 mm | 10 mm | 60-100 mm | 40 mm | 60-100 mm |
| Loading condition | plate workpiece, as well as triple rotation: 10 workpieces on one plate | triple rotation; 40 workpieces on one plate | plate workpiece, as well as triple rotation, as in Example 1 | triple rotation; 30 workpieces on one plate | triple rotation; 30 workpieces on one plate | triple rotation; 30 workpieces on one plate |
| Number of trees | 12 | 6 | 6 | 12 | 12 | 6 |
| Amplitude voltage | −800-1000 V | −800-1000 V | −800-1000 V | −800-1000 V | −800-1000 V | −800-1000 V |
| Substrate current | 0.5-1.5 A | 1.5-4.0 A | 1.5-4.0 A | 2.0-6.0 A | 2.0-20 A unstable | 4.0-12 A |
| Signal frequency | 50 kHz | 50 kHz | 50 kHz | 50 kHz | 50 kHz | 100 kHz |
| Deposition rate | 0.2 μm/h | 0.9 μm/h | 0.9 μm/h | 1.5 μm/h | — | 2.0-2.5 μm/h |
| Part temperature | 200° C. | 200° C. | 200-250° C. | >250° C. | >250° C. | −250° C. |

What is claimed is:

1. A vacuum treatment installation for plasma treatment, in particular for the plasma coating of workpieces, comprising at least one arrangement for boosting and/or igniting a glow discharge plasma for the treatment of said workpieces, said arrangement comprising at least one hollow body of an electrically conductive material, the hollow body comprising a hollow space and at least one opening at an entrance to the hollow space through which charge carriers can flow off into environs of the arrangement in order to make here possible ignition and operation of a plasma or to boost a plasma existing here, the hollow body comprising at least two cathode annuli having a hollow space and at least one lateral surface, which comprises at least a part of said lateral surface being a surface of a grid and of at least a part of said lateral surface being realized by mutually distant rods, wherein the hollow space of the hollow body is formed such that when an electric signal is applied to the hollow body, at least in a certain pressure and voltage range, geometric conditions for the ignition of a discharge in the interior of the hollow body are satisfied and wherein said hollow body is not a workpiece carrier.

2. The vacuum treatment installation as claimed in claim 1, comprising a vacuum chamber comprising a chamber bottom and a chamber cover, wherein said at least one arrangement is mounted to one of said chamber bottom and of said chamber cover.

3. The vacuum treatment installation as claimed in claim 1, wherein the geometric conditions are satisfied for a pressure range between $1 \times 10^{-3}$ and $5 \times 10^{-2}$ mbar.

4. The vacuum treatment installation as claimed in claim 1, wherein the geometric conditions are satisfied for a pressure range between $4 \times 10^{-3}$ and $2 \times 10^{-2}$ mbar.

5. The vacuum treatment installation as claimed in claim 1, wherein the electric signal is a DC voltage or an AC voltage.

6. The vacuum treatment installation as claimed in claim 1, wherein the electric signal is a bipolar or unipolar pulsed AC voltage signal in the medium frequency range.

7. The vacuum treatment installation as claimed in claim 1, wherein the geometric conditions for an electric signal are satisfied with a voltage range between 200 and 2000 V.

8. The vacuum treatment installation as claimed in claim 1, wherein the geometric conditions for an electric signal are satisfied with a voltage range between 400 and 1200 V.

9. The vacuum treatment installation as claimed in claim 1, wherein the hollow body has at least one of a top-opening and of a bottom opening, said at least one opening being covered with a grid.

10. The vacuum treatment installation as claimed in claim 1, said hollow space being within a lateral surface having a plurality of through openings.

11. The vacuum treatment installation as claimed in claim 10, wherein said through-openings comprises at least one of at least a part of said surface being a surface of a grid and of at least a part of said surface being realized by mutually distant rods.

12. The vacuum treatment installation as claimed in claim 9, wherein the distance d' is less or equal to the twofold, however greater or equal to the simple cathode drop distance in a certain pressure and voltage range.

13. The vacuum treatment installation as claimed in claim 1, the hollow body having a hollow space with a cross-sectional distance decisive for said conditions d' and having the form of a circle, an ellipse or a polygon or a form composed of different of these geometries, wherein said distance d' is one of between 20 to 200 mm and of between 60 and 100 mm.

14. The vacuum treatment installation as claimed in claim 1, wherein the hollow body comprises several circular, elliptical or polygonal annuli or annuli of combined geometries, disposed one above the other, wherein the annuli are disposed at a mutual distance a, which is sufficiently small to avoid the ignition of a discharge between the annuli.

15. The vacuum treatment installation as claimed in claim 14, wherein the distance a is smaller than the cathode drop distance in said certain pressure and voltage range.

16. The vacuum treatment installation as claimed in claim 15, wherein the distance a is one of between 1 and 60 mm and of between 5 and 25 mm.

\* \* \* \* \*